(12) United States Patent
Sakai

(10) Patent No.: US 8,994,470 B2
(45) Date of Patent: Mar. 31, 2015

(54) CIRCUIT SUBSTRATE HAVING NOISE SUPPRESSION STRUCTURE

(75) Inventor: Jun Sakai, Tokyo (JP)

(73) Assignee: Lenovo Innovations Limited (Hong Kong), Hong Kong (HK)

( * ) Notice: Subject to any disclaimer, the term of this patent is extended or adjusted under 35 U.S.C. 154(b) by 0 days.

(21) Appl. No.: 14/113,187

(22) PCT Filed: Apr. 25, 2012

(86) PCT No.: PCT/JP2012/061107
§ 371 (c)(1),
(2), (4) Date: Oct. 21, 2013

(87) PCT Pub. No.: WO2012/147803
PCT Pub. Date: Nov. 1, 2012

(65) Prior Publication Data
US 2014/0049343 A1    Feb. 20, 2014

(30) Foreign Application Priority Data

Apr. 28, 2011  (JP) ................................ 2011-100971

(51) Int. Cl.
*H01P 7/08*  (2006.01)
*H05K 1/02*  (2006.01)
(Continued)

(52) U.S. Cl.
CPC ............... *H01P 7/08* (2013.01); *H05K 1/0225* (2013.01); *H05K 1/0243* (2013.01);
(Continued)

(58) Field of Classification Search
None
See application file for complete search history.

(56) References Cited

U.S. PATENT DOCUMENTS 5,336,855 A    8/1994 Kahlert et al.

2007/0285316 A1*  12/2007 Saily et al. ............... 343/909
2010/0007445 A1*   1/2010 Ishizaki et al. ............ 333/204

FOREIGN PATENT DOCUMENTS

| DE | 4100238 | 7/1992 |
| EP | 495540 | 7/1992 |
| JP | 04-307799 | 10/1992 |
| JP | 2001-308538 | 11/2001 |

(Continued)

OTHER PUBLICATIONS

International Search Report corresponding to PCT/JP2012/061107, dated Jun. 4, 2012, 4 pages.

*Primary Examiner* — Long Nguyen
(74) *Attorney, Agent, or Firm* — Wilmer Cutler Pickering Hale and Dorr LLP

(57) ABSTRACT

A circuit substrate has three wiring layers, wherein a signal line is formed in a first wiring layer; a ground plane is formed in a second wiring layer; a resonant line is formed in a third wiring layer. A circumferential slit is formed in the ground plane, wherein an island electrode separated from the ground plane is formed inside the slit. The left end of the resonant line is connected to the island electrode through an interlayer-connecting via, while the right end of the resonant line is connected to the ground plane through an interlayer-connecting via. A transmission line (or a microstrip line) is formed using the signal line and the ground plane, and therefore a complex resonator is formed to embrace the transmission line. This achieves band elimination with regard to a signal component of a resonance frequency among signals propagating through the microstrip line. Thus, it is possible to form a noise suppression structure without mounting additional parts on the circuit substrate, and therefore it is possible to effectively eliminate power distribution noise and noise propagating through the signal line with a small and simple configuration.

10 Claims, 17 Drawing Sheets

(51) Int. Cl.
   *H01P 1/203* (2006.01)
   *H05K 1/16* (2006.01)
(52) U.S. Cl.
   CPC ........... *H01P 1/20345* (2013.01); *H01P 7/082* (2013.01); *H05K 1/165* (2013.01); *H05K 2201/09263* (2013.01); *H05K 2201/09336* (2013.01); *H05K 2201/09781* (2013.01); *H05K 1/0253* (2013.01)
   USPC ............................ 333/12; 333/204; 333/219

(56) References Cited

FOREIGN PATENT DOCUMENTS

| | | |
|---|---|---|
| JP | 2002-368355 | 12/2002 |
| JP | 2005-322861 | 11/2005 |
| JP | 2005-340733 | 12/2005 |
| JP | 2007-243007 | 9/2007 |
| JP | 2009-224566 | 10/2009 |
| JP | 2010-199109 | 9/2010 |

* cited by examiner

FIG. 1
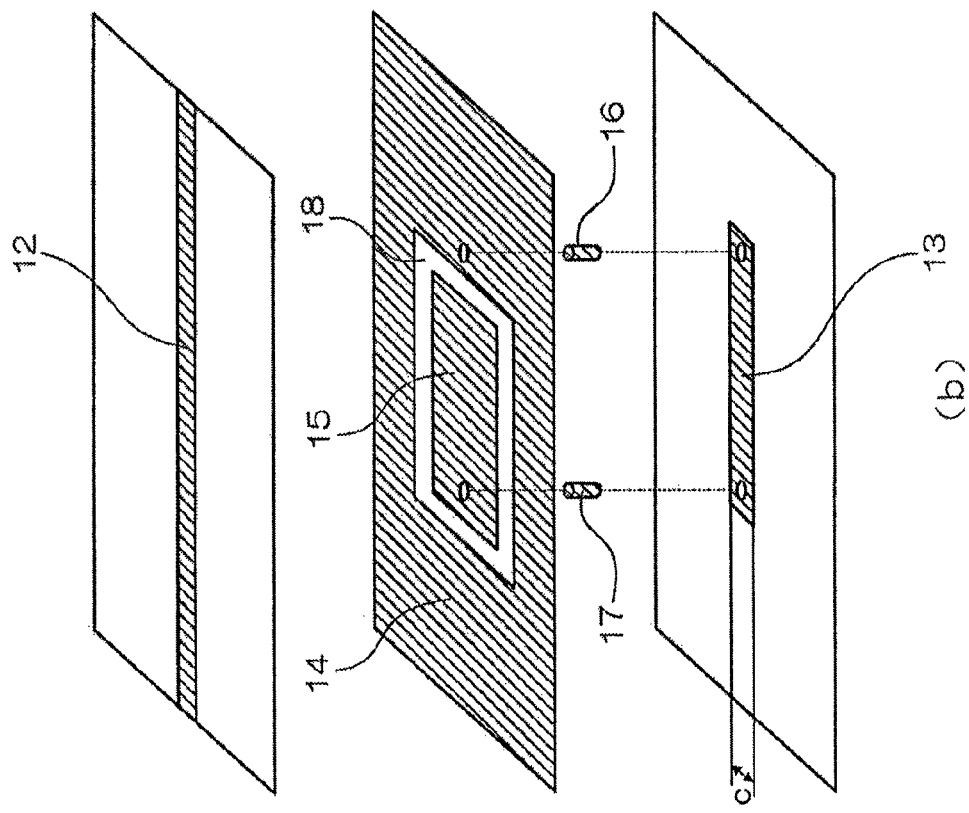
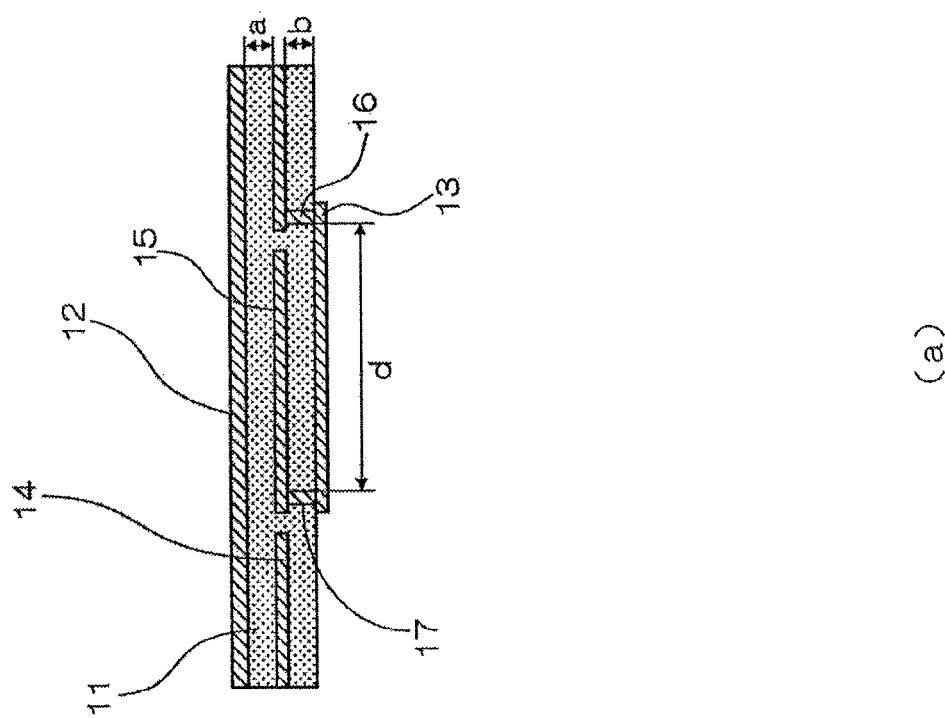

FIG. 4
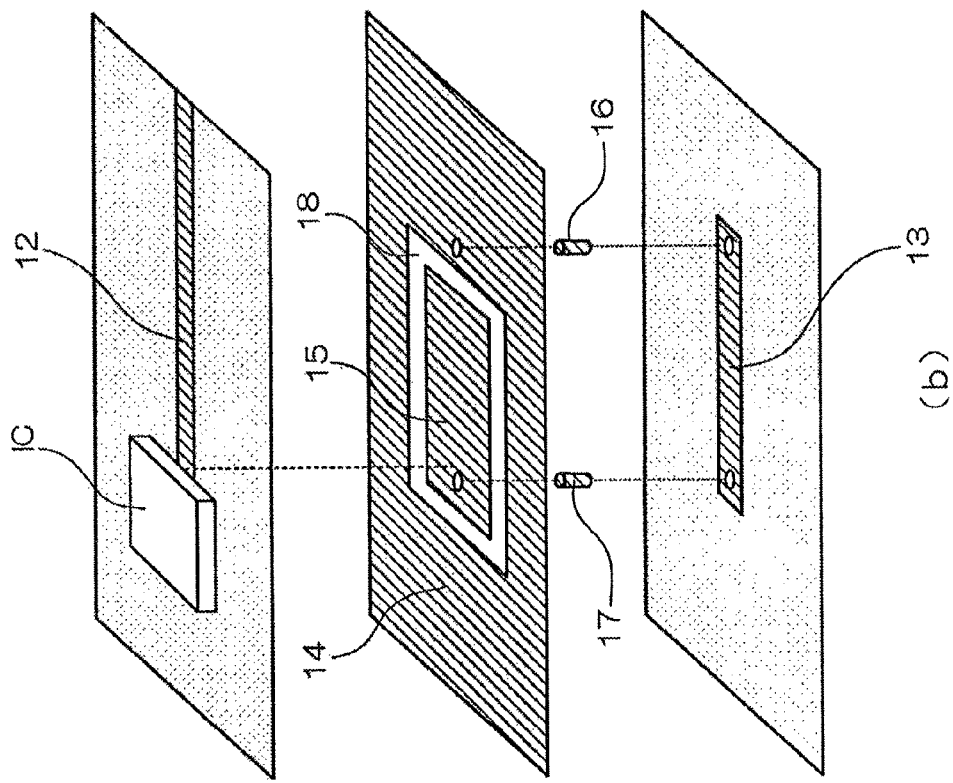
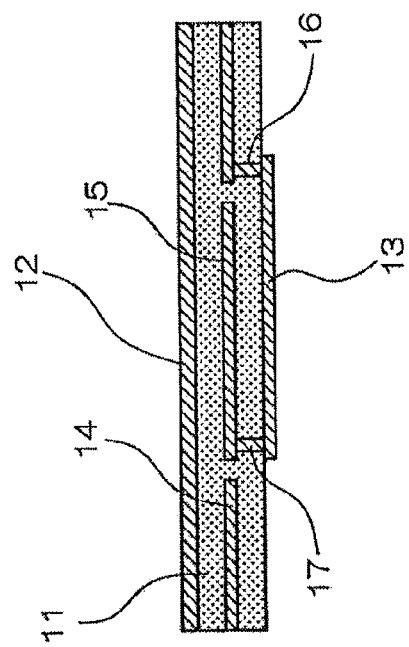

FIG. 7
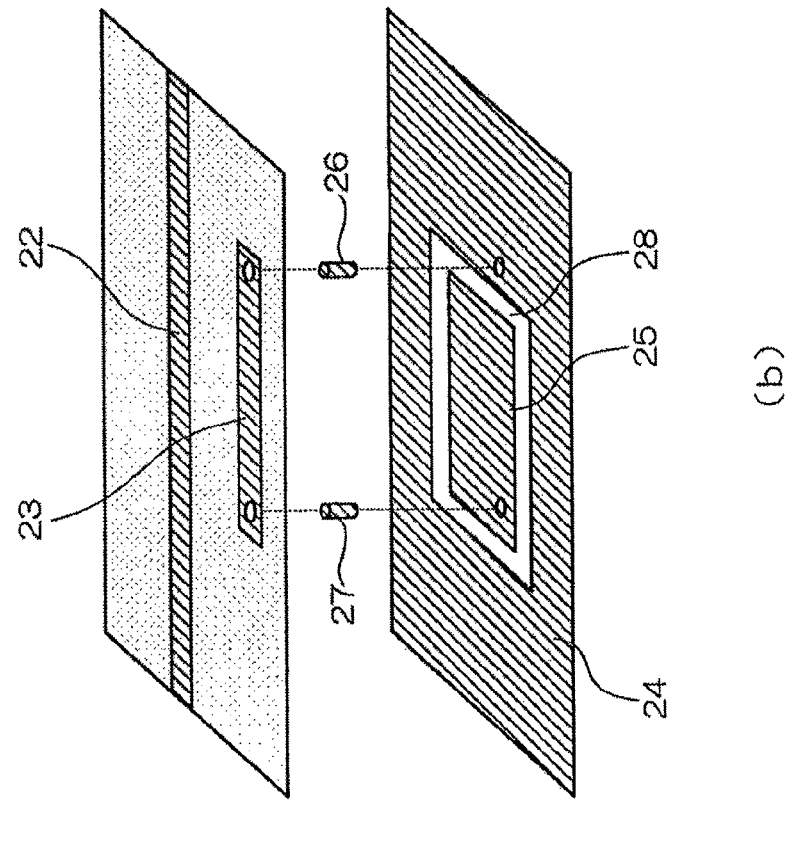
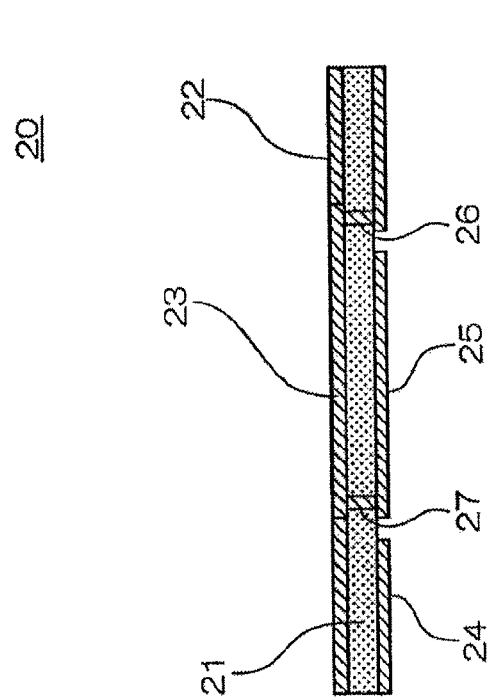

FIG. 10
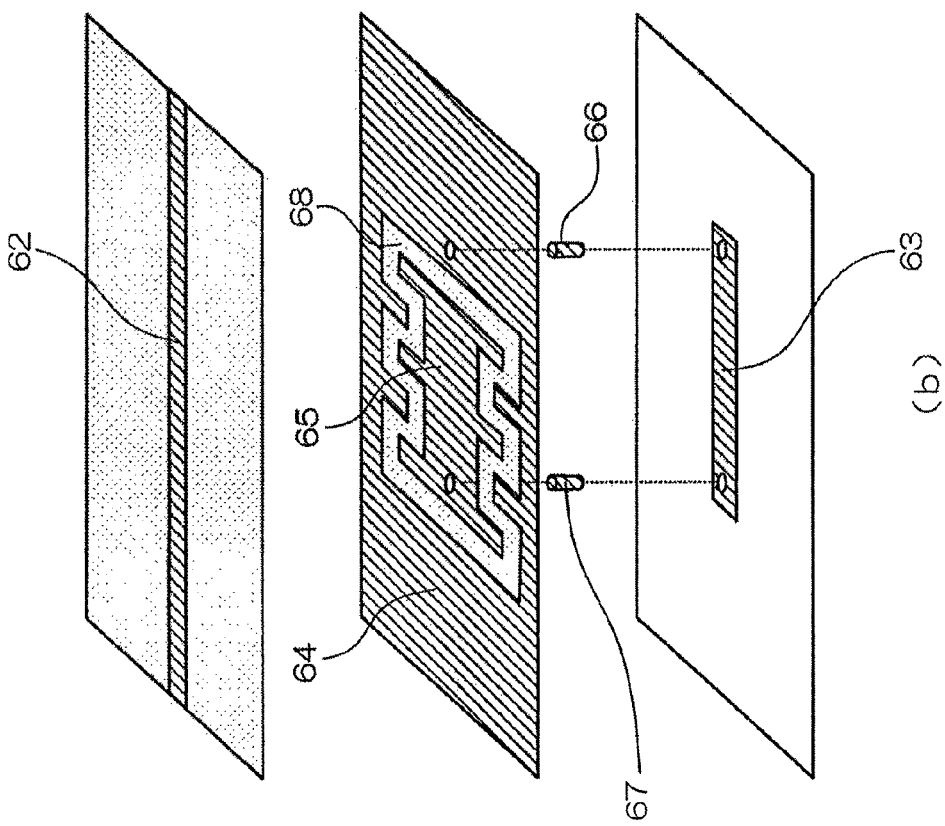
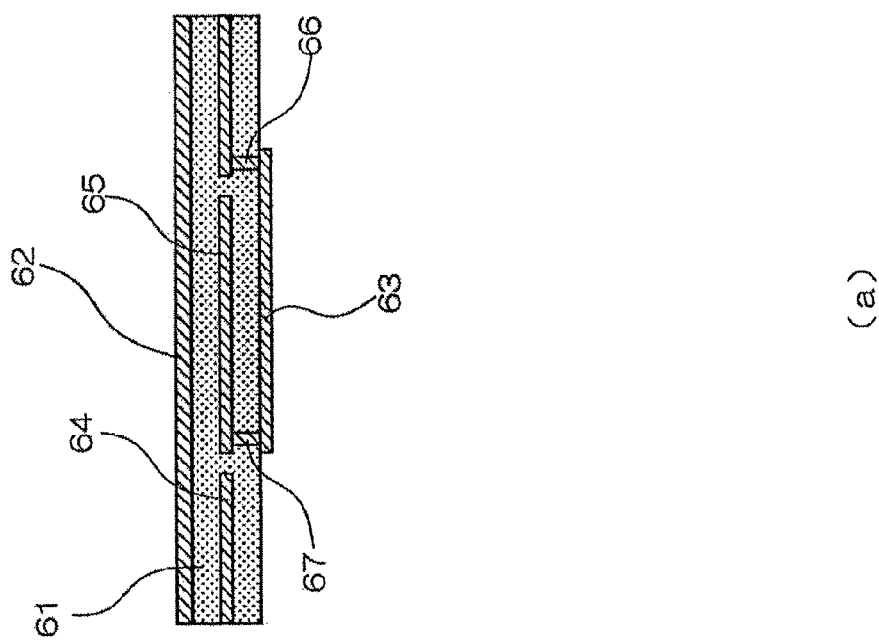

FIG. 18
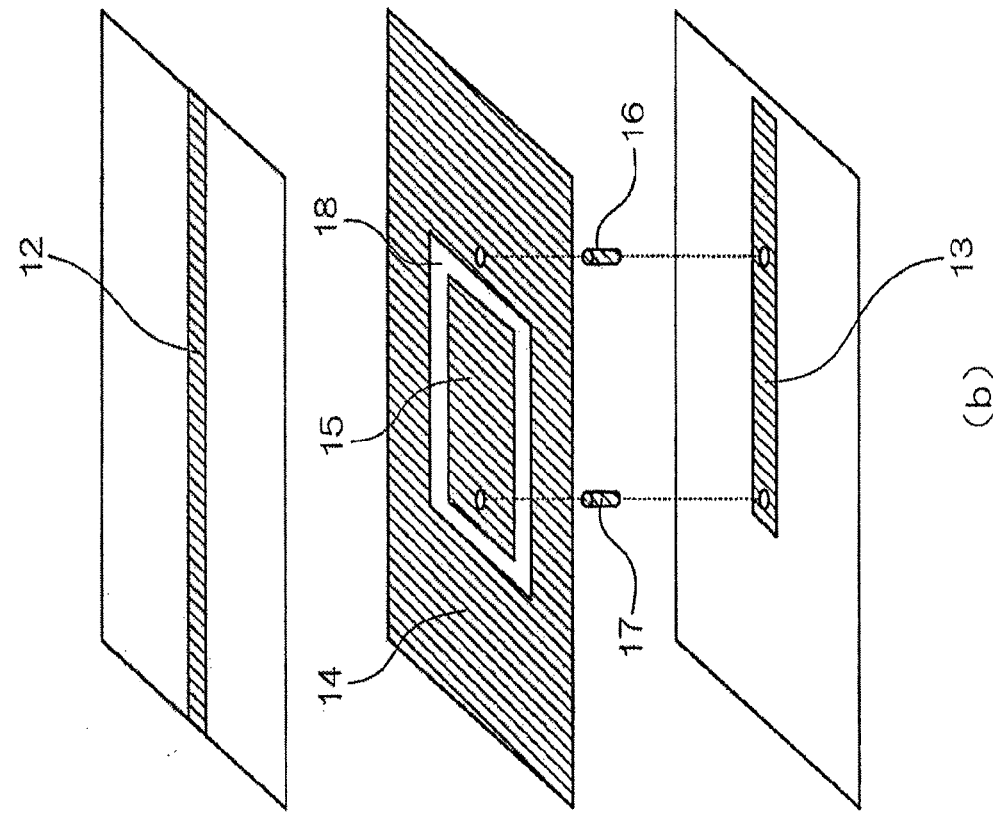
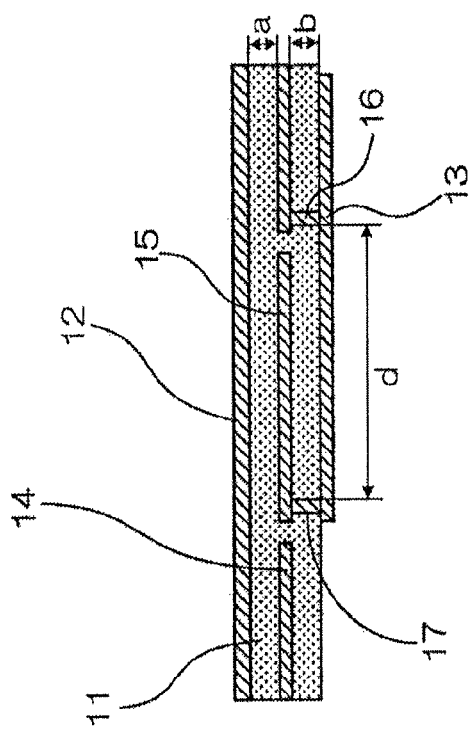

CIRCUIT SUBSTRATE HAVING NOISE SUPPRESSION STRUCTURE

TECHNICAL FIELD

The present invention relates to a circuit substrate having a noise suppression structure adapted to a radio communication device and an electronic device.

This application is a national stage application of International Application No. PCT/JP2012/061107 entitled "Circuit Substrate Having Noise Suppression Structure," filed on Apr. 25, 2012, which claims priority to Japanese Patent Application No. 2011-100971, filed on Apr. 28, 2011, the disclosures of each of which are hereby incorporated by reference in their entirety.

BACKGROUND ART

Conventionally, various types of circuit substrates (e.g. printed circuit boards) have been installed in radio communication devices and electronic devices (e.g. cellular phones, personal computers having wireless communication functions, and handheld information terminals). However, electronic devices in which semiconductor devices and integrated circuits are mounted on circuit substrates suffer from problems in that electromagnetic waves of parts may cause electromagnetic noise to influence other parts, resulting in occurrence of erroneous operations. As noise propagation paths, power distribution systems may propagate noise to influence electronic circuits, or noise may directly influence signal lines.

A noise-generating structure owing to a power distribution system will be described.

FIG. 12 is a perspective view of a circuit substrate 101 mounting a plurality of integrated circuits (LSI circuits) 102 to 105 thereon. As high-speed signal transmission paths, signal lines 106 and 107 are wired between integrated circuits 102 and 103 and between integrated circuits 104 and 105. Additionally, a plurality of bypass capacitors 108 is mounted on the circuit substrate 101. A ground plane GND is formed around these parts on the surface of the circuit substrate 101. A power plane (not shown) is formed as an internal layer inside the circuit substrate 101. A power source 109 is mounted on the circuit substrate 101 and connected to the power plane and the ground plane GND.

Next, the operation of the circuit substrate 101 shown in FIG. 12 will be described.

FIG. 13 is an equivalent circuit of the circuit substrate 101 precluding the bypass capacitor 108. In FIG. 13, due to switching on/off of transistors (not shown) caused by a signal flowing from the integrated circuit 102 to the integrated circuit 103, a charging/discharging current I may flow from the power source 109 to the power terminal or the ground plane GND. At this time, a voltage drop may occur due to parasitic inductance of the power plane or the ground plane GND at a position between the integrated circuits 102 and 104; hence, a source voltage is correspondingly reduced to exert an influence of power noise N on the integrated circuit 104.

To suppress the above voltage drop, it is necessary to mount the bypass capacitor 108 in proximity to the integrated circuits 102 to 105.

FIG. 14 is an equivalent circuit of the circuit substrate 101 mounting the bypass capacitor 108 thereon. Herein, the capacitor 108 is connected between the power terminal and the ground terminal with respect to each of the integrated circuits 102 to 105. In this circuit configuration, for example, when a signal flows from the integrated circuit 102 to the integrated circuit 103, a charging/discharging current I is supplied to the bypass capacitor 108, positioned proximate to the integrated circuit 102, through a path shown by a dashed line. For this reason, a high-frequency current may not flow outside the loop configured of the integrated circuit 102 and the bypass capacitor 108; hence, it is possible to reduce an influence of the charging/discharging current I exerted on the other integrated circuits 103 to 105.

Next, the structure in which noise directly influences signal lines will be described.

FIG. 15 is a perspective view of the circuit substrate 101 mounting a plurality of integrated circuits 102 to 105 thereon. As high-speed signal transmission paths, the signal lines 106 and 107 are wired between the integrated circuits 102 and 103 and between the integrated circuits 104 and 105. The signal line 106 causing an electromagnetic field due to a signal transmitted therethrough may be electromagnetically coupled with the signal line 107 by way of the surrounding space and the circuit substrate 101. For this reason, an electromagnetic influence of the signal line 106 may be superimposed on a signal S1 as noise N, thus causing a degraded signal S2 to be transmitted to the integrated circuit 105.

For this reason, it is necessary to insert a filter into a signal line so as to eliminate noise N coupled with the signal line. In FIG. 15, a plurality of chip inductors 109 is serially inserted into the signal line 107 while a chip capacitor 110 is inserted in parallel, thus forming a T-shape filter. The T-shape filter serves as a low-pass filter (LPF) which is able to eliminate high-frequency noise.

FIGS. 16($a$) to ($e$) show configurations of LPFs using inductors and capacitors. FIG. 16($a$) shows an LPF in which an inductor 120 is serially connected to a signal line. FIG. 16($b$) shows an LPF in which a capacitor 130 is inserted between a signal line and ground in parallel. FIG. 16($c$) shows an L-shaped LPF in which an inductor 121 is serially connected to a signal line while a capacitor 131 is inserted between a signal line and ground in parallel. FIG. 16($d$) shows a T-shaped LPF which is configured of inductors 122, 123 and a capacitor 132. FIG. 16($e$) shows a π-shaped LPF which is configured of an inductor 124 and capacitors 133, 134. The above LPF is inserted into a dotted block 140 positioned between the integrated circuits 104 and 105 in an equivalent circuit shown in FIG. 17 (i.e. an equivalent circuit for the integrated circuits 104 and 105 shown in FIG. 15), thus eliminating high-frequency noise coupled with a signal line.

Other than the noise suppression structure for mounting inductors and capacitors on the circuit substrate 101, a variety of noise suppression structures has been proposed. For example, Patent Literature 1 discloses a noise suppression structure for multilayered printed circuit boards. In this noise suppression structure, a first conductor transmitting a high-frequency current therethrough is electromagnetically coupled with a noise suppression layer through an insulating layer, while the noise suppression layer is electromagnetically coupled with a second conductor through the insulating layer.

Patent Literature 2 discloses a noise reduction method in a circuit substrate. Herein, high-frequency noise, caused by an integrated circuit (IC), flows from an IC ground terminal to a first via-hole by way of an IC ground pattern formed in a surface wiring layer; it flows from the first via-hole to a first ground pattern; it flows from the first ground pattern to a third ground pattern, which is formed in a base wiring layer, by way of a second via-hole; it flows from the third ground pattern by way of a third via-hole and a second ground pattern, and then it is discharged into the external space.

Patent Literature 3 discloses a memory module for suppressing noise emission. Herein, a multilayered printed circuit board includes a plurality of signal lines or a power pattern as well as a surrounding ground pattern, which is connected through a connecting via. Additionally, a plane antenna configured of a surrounding ground pattern causes an electric field in an opposite direction so as to suppress noise emission from a multilayered printed circuit board.

CITATION LIST

Patent Literature

Patent Literature 1: Japanese Patent Application Publication No. 2007-243007
Patent Literature 2: Japanese Patent Application Publication No. 2005-322861
Patent Literature 3: Japanese Patent Application Publication No. 2005-340733

SUMMARY OF INVENTION

Technical Problem

The noise suppression structure using the circuits shown in FIGS. 14 and 15 needs inductors and capacitors to be mounted on the circuit substrate 1. For this reason, it is necessary to arrange an area for mounting circuit components on the circuit substrate 101, thus expanding the scale of the circuit substrate 101. Additionally, it is necessary to shoulder the cost for managing circuit components in addition to the cost of circuit components; this may increase working routines and lead times for mounting circuit components on the circuit substrate 101. Moreover, it is necessary to allocate filters to individual lines in the structure in which filters are inserted into signal lines, thus increasing design steps. Certain types of electronic devices may need to mount several tens to several hundreds of capacitors and inductors on a single circuit substrate, thus increasing the area for mounting circuit components, the cost thereof, and the design/manufacture time thereof.

The noise suppression structure disclosed in Patent Literature 1 has a multilayered structure in which a single noise suppression layer is electromagnetically coupled with first and second conductors through an insulating layer. To obtain a desired noise suppression effect, it is necessary to form a noise suppression layer having an adequate area. In particular, it is necessary to develop a noise suppression structure, having a small mounting area on a circuit substrate, for use in radio communication devices which have been reduced in size and thickness. However, the noise suppression structure of Patent Literature 1 including resonators in the same plane needs to increase a mounting area for suppressing low-frequency noise.

The noise suppression techniques disclosed in Patent Literatures 2 and 3 are designed to simply form paths for releasing noise or to suppress electromagnetic noise, emitted from a printed circuit board, without considering frequency characteristics of signals transmitted through signal lines; hence, they are unable to efficiently eliminate noise occurring in the power distribution system, and noise propagating through signal lines.

The present invention is made in consideration of the aforementioned circumstances, wherein it is an object of the present invention to provide a circuit substrate which can be reduced in size and which is able to eliminate noise of the power distribution system and noise propagating through signal lines without mounting additional circuit components.

Solution to Problem

The present invention is designed to form a noise suppression structure in a circuit substrate in which a transmission line is configured of a first conductor (e.g. a signal line) and a second conductor (e.g. a ground plane) which are positioned opposite to each other in different wiring layers. Specifically, a circumferential slit is formed in the second conductor, while an island electrode separated from the second conductor is formed inside the slit. A third conductor (e.g. a resonant line) is formed in a wiring layer which differs from the second conductor, wherein the third conductor is connected to the second conductor and the island electrode through a plurality of interlayer-connecting vias. It is possible to configure a complex resonator encompassing a transmission line when the first conductor is arranged to partially overlap with the island electrode in plan view. The complex resonator serves as a band-elimination filter at a resonance frequency.

Advantageous Effects of Invention

According to the present invention, it is possible to effectively eliminate noise of the power distribution system and noise propagating through signal lines with a simple and small structure without mounting additional components on a circuit substrate.

BRIEF DESCRIPTION OF DRAWINGS

FIG. 1 shows a cross-sectional view and an exploded view with respect to a circuit substrate having a noise suppression structure according to a first embodiment of the present invention.
FIG. 4 includes a cross-sectional view and an exploded view with respect to a circuit substrate according to a second variation of the first embodiment.
FIG. 7 shows a cross-sectional view and an exploded view with respect to a circuit substrate having a noise suppression structure according to a second embodiment of the present invention.
FIG. 10 shows a cross-sectional view and an exploded view with respect to a circuit substrate having a noise suppression structure according to a fifth embodiment of the present invention.

FIG. 18 shows a cross-sectional view and an exploded view with respect to a circuit substrate according to a third variation of the first embodiment with a resonant line extended in the right side.

DESCRIPTION OF EMBODIMENTS

Figure 2:
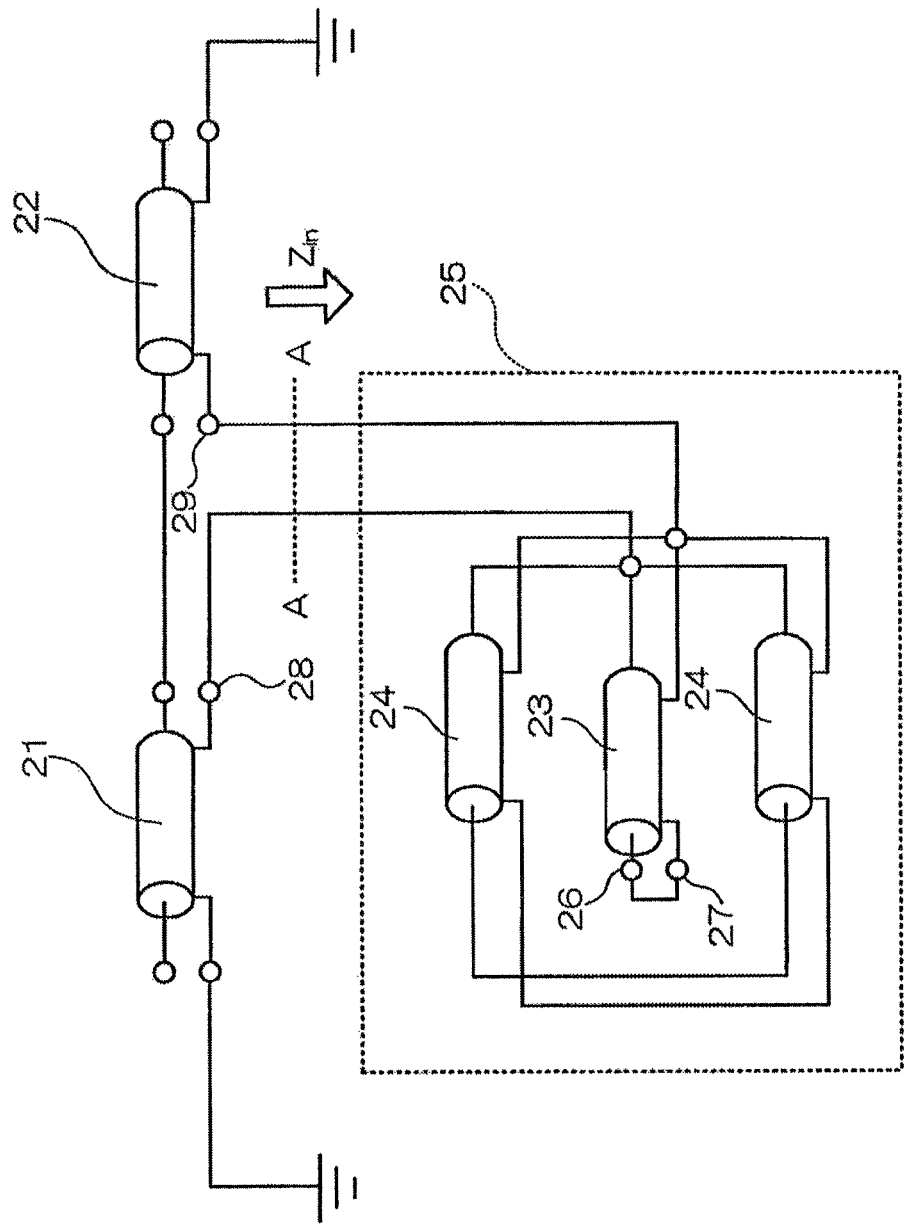
FIG. 2 is an equivalent circuit diagram for illustrating the function of the noise suppression structure according to the first embodiment.

Circuit substrates having noise suppression structures according to the present invention will be described by way of embodiments with reference to the accompanying drawings.

First Embodiment

FIG. 1 shows a circuit substrate 11 having a noise suppression structure 10 according to the first embodiment of the present invention. In FIG. 1, (a) shows a cross-sectional view of the circuit substrate 11, while (b) shows an exploded view of the circuit substrate 11. The circuit substrate 11 includes first, second, and third wiring layers. A signal line 12 is formed in the first wiring layer, while a resonant line 13 is formed in the third wiring layer. A ground plane 14 and an island electrode 15, which is separated inwardly of a slit 18 having a circumferential shape, are formed in the second wiring layer. The left end of the resonant line 13 is connected to the island electrode 15 through an interlayer-connecting via 17, while the right end of the resonant line 13 is connected to the ground plane 14 through an interlayer-connecting via 16.

FIG. 2 is an equivalent circuit diagram for illustrating the function of the noise suppression structure 10 according to the first embodiment. The equivalent circuit diagram of the noise suppression structure 10 shows the wiring system of the circuit substrate 11, wherein cylindrical elements specified by reference signs 21 to 24 are transmission circuit models showing transmission paths in the circuit substrate 11. In each of the transmission circuit models 21 to 24, the left and right ends are connected to signal lines, while the lower end is connected to a reference terminal. In this connection, solid lines connecting between the transmission circuit models 21 to 24 indicate electrical connections but do not necessarily indicate electrical characteristics (e.g. wire lengths).

The transmission circuit line 21 indicates a microstrip line configured of the signal line 12, the ground plane 14, and the island electrode 15 in the area which is leftward from the right end of the slit 18 shown in FIG. 1. The transmission circuit model 22 indicates a microstrip line configured of the signal line 12 and the ground plane 14 in the area which is rightward from the right end of the slit 18. The transmission circuit model 23 indicates a transmission line of a parallel-plate type configured of the resonant line 13 and the island electrode 15. Two transmission circuit models 24 show slit lines which are formed using the slit 18 between the ground plane 14 and the island electrode 15.

The transmission circuit models 23 and 24 form a complex resonator 25 having a common input part. Herein, two transmission circuit models 24 are connected together in a circumferential manner, while a left terminal 26 of the transmission circuit model 23 is short-circuited with a ground 27. Additionally, a reference terminal 28 of the transmission circuit model 21 is separated from a reference terminal 29 of the transmission circuit model 22, wherein the reference terminals 28 and 29 are connected to the input part of the complex resonator 25.

The input impedance of the complex resonator 25 in view of the open end A-A of the resonant line 13 becomes maximum at a resonance frequency, and therefore it is possible to eliminate a signal component of a certain band corresponding to the resonance frequency among signals propagating through the microstrip line.

Next, the manufacturing method of the circuit substrate 11 will be described.

It is possible to use a general-purpose substrate for the circuit substrate 11. For example, it is possible to use substrates made of organic materials (e.g. epoxy, polyimide, fluororesin, PPE resin, and phenol resin) or substrates made of insulating materials (e.g. ceramics, glass, silicon, and composite materials). As a patterning formation method for each layer of a substrate, it is possible to employ etching or lithography printing techniques. In a method of forming the interlayer-connecting vias 16 and 17 in the circuit substrate 11, holes are formed in insulating materials by way of laser irradiation or drilling and then filled with metal pastes or plating, thus forming conducting parts.

The circuit substrate 11 of the first embodiment has a three-layered structure; but this is not a restriction. It is possible to produce another type of the circuit substrate 11 having multiple layers, i.e. more than three layers. For example, it is possible to produce a circuit substrate having four or more wiring layers, wherein the structure of the first embodiment is applied to three wiring layers so as to demonstrate a noise-eliminating effect.

The circuit substrate 11 of the first embodiment includes the slit 18 and the island electrode 15 both having a rectangular shape; but this is not a restriction; hence, it is possible to employ other shapes. For example, it is possible to employ circular shapes, elliptical shapes, or polygonal shapes for the slit 18 and the island electrode 15. Regardless of the shape it is possible to demonstrate a noise suppression effect on the condition that the slit 18 and the island electrode 15 can be combined to form a slot line without any other electrode being interposed therebetween.

Next, variations of the first embodiment will be described.

Figure 3:
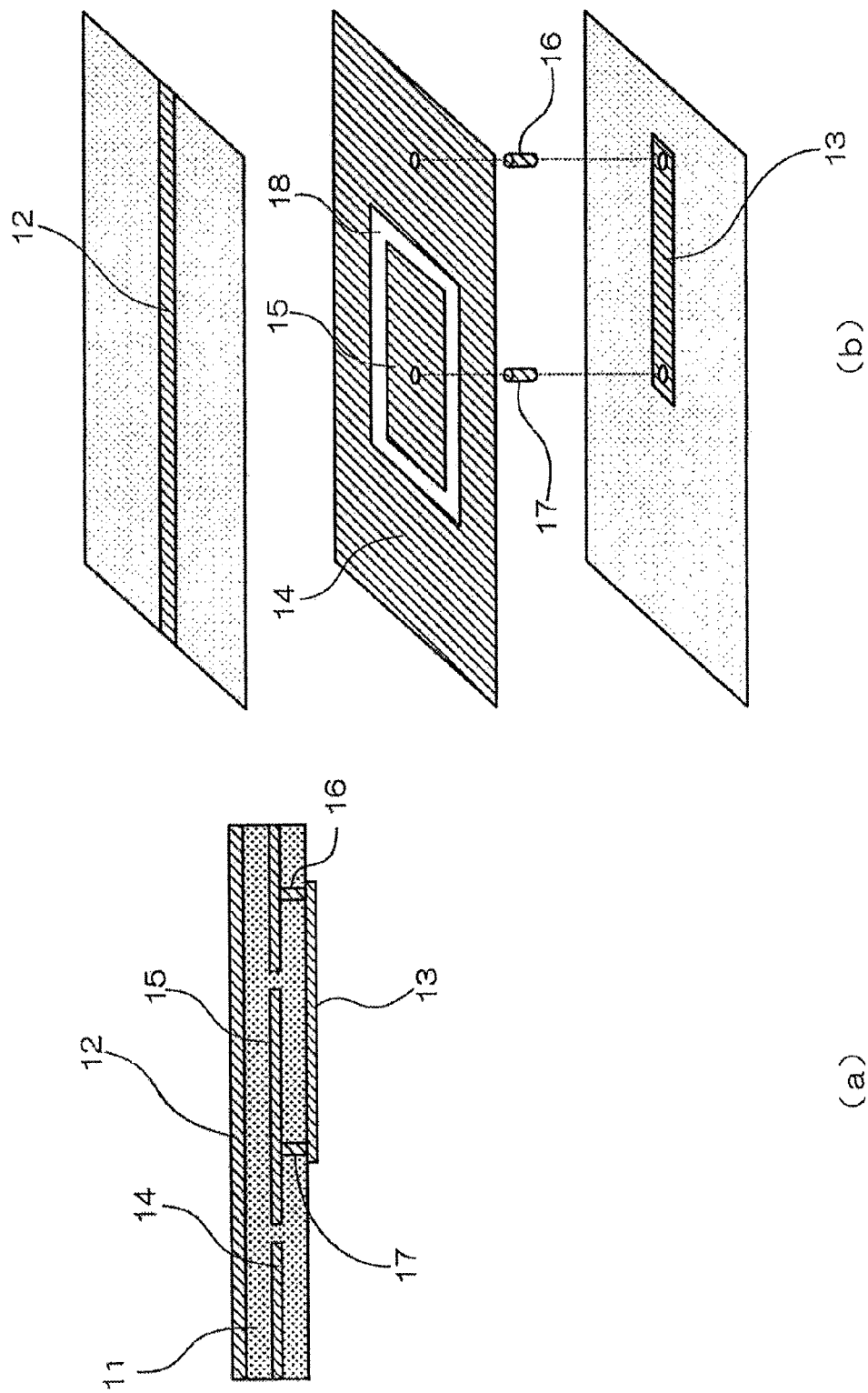
FIG. 3 shows a cross-sectional view and an exploded view with respect to a circuit substrate according to a first variation of the first embodiment.

In the first embodiment shown in FIG. 1, the interlayer-connecting vias 16 and 17 are positioned in contact with the slit 18 separating the island electrode 15 from the ground plane 14, wherein a large part of the resonant line 13 overlaps with the island electrode 15 in plan view but does not substantially overlap with the ground plane 14; but this is not a restriction. FIG. 3 shows a first variation of the first embodiment in which the resonant line 13 and the interlayer-connecting vias 16 and 17 are subjected to parallel translation so that the resonant line 13 can overlap with the ground plane 14 in plan view. The first variation offers a complex resonator encompassing three resonators such as a loop-type slot line resonator, a short-termination resonator of a transmission line including the resonant line 13 and the island electrode 15, and a short-termination resonator of a transmission line including the resonant line 13 and the ground plane 14.

In the first embodiment shown in FIG. 1, the signal line 12 is formed to cross over the slit 18 twice; but this is not a restriction. It is possible to design a second variation of the first embodiment shown in FIG. 4 in which the signal line 12 is relocated to cross over the circumferential slit 18 once. In FIG. 4, the signal line 12 is connected to an integrated circuit IC disposed above the island electrode 15 and thus terminated at this position. In the second variation, a resonator operates in connection with an input part of the resonant line 13 corresponding to a part of the signal line 12 crossing over the slit 18 between the island electrode 15 and the ground plane 14, thus suppressing noise at the resonance frequency.

In the first embodiment shown in FIG. 1, the left end of the resonant line 13 is connected to the island electrode 15 through the interlayer-connecting via 17, while the right end of the resonant line 13 is connected to the ground plane 14 through the interlayer-connecting via 16. FIG. 18 shows a circuit substrate according to a third variation of the first embodiment, wherein, compared with the circuit substrate 11 shown in FIG. 1, the resonant line 13 is extended in the right side. In the third variation, the left end of the resonant line 13 is connected to the island electrode 15 through the interlayer-connecting via 17, while the right end of the resonant line 13 at a predetermined position is connected to the ground plane 14 through the interlayer-connecting via 16. In FIG. 18, the resonant line 13 is extended in the right side, but it is possible to extend the resonant line 13 in the left side, or it is possible to extend the resonant line 13 in both sides.

Figure 19:
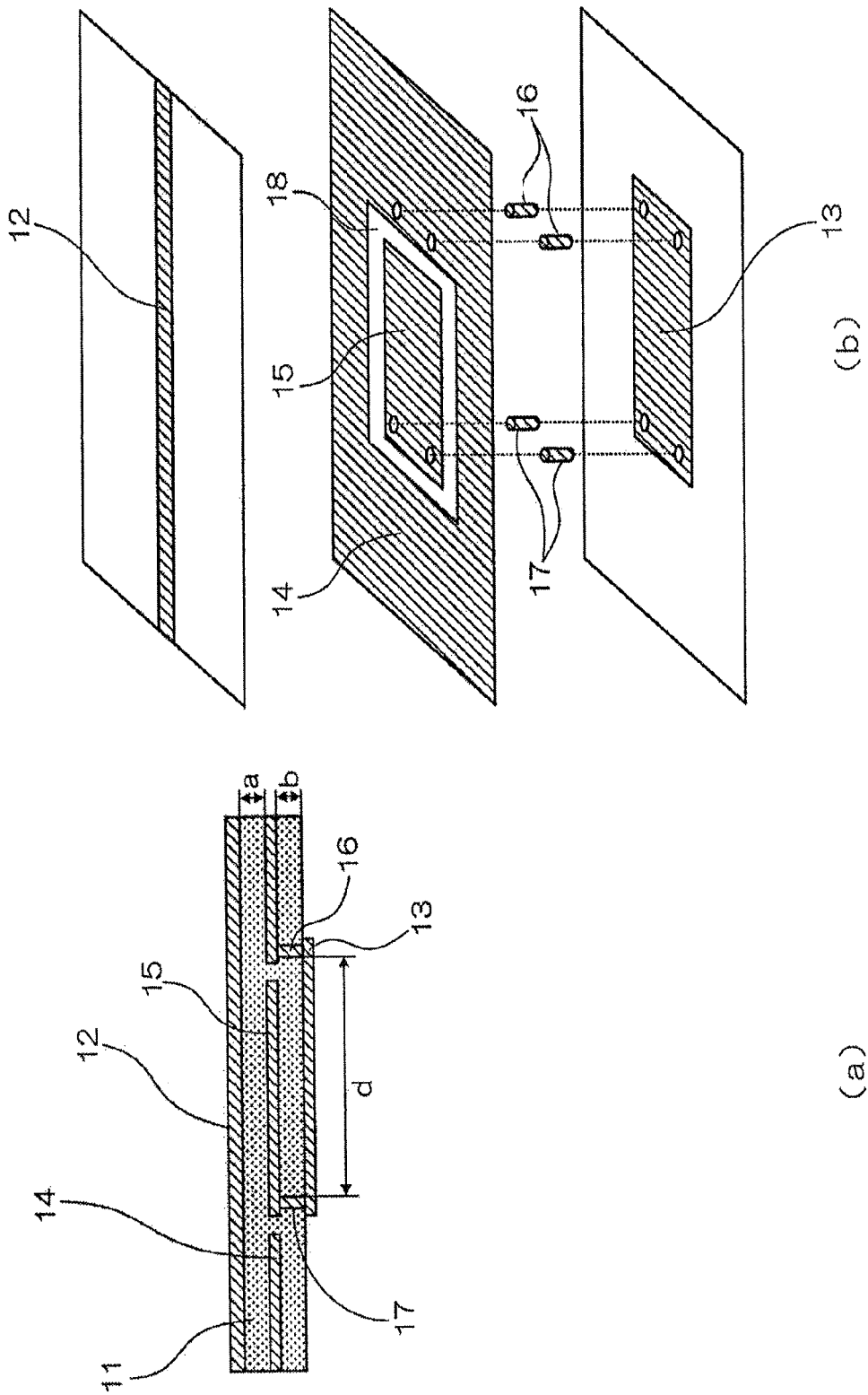
FIG. 19 shows a cross-sectional view and an exploded view with respect to a circuit substrate according to a fourth variation of the first embodiment with a resonant line having an increased width.

FIG. 19 shows a circuit substrate according to a fourth variation of the first embodiment, wherein, compared to the circuit substrate 11 shown in FIG. 1, the width of the resonant line 13 is expanded; the left end of the resonant line 13 is connected to the island electrode 15 through a pair of interlayer-connecting vias 17; the right end of the resonant line 13 is connected to the ground plane 14 through a pair of interlayer-connecting vias 16.

Figure 5:
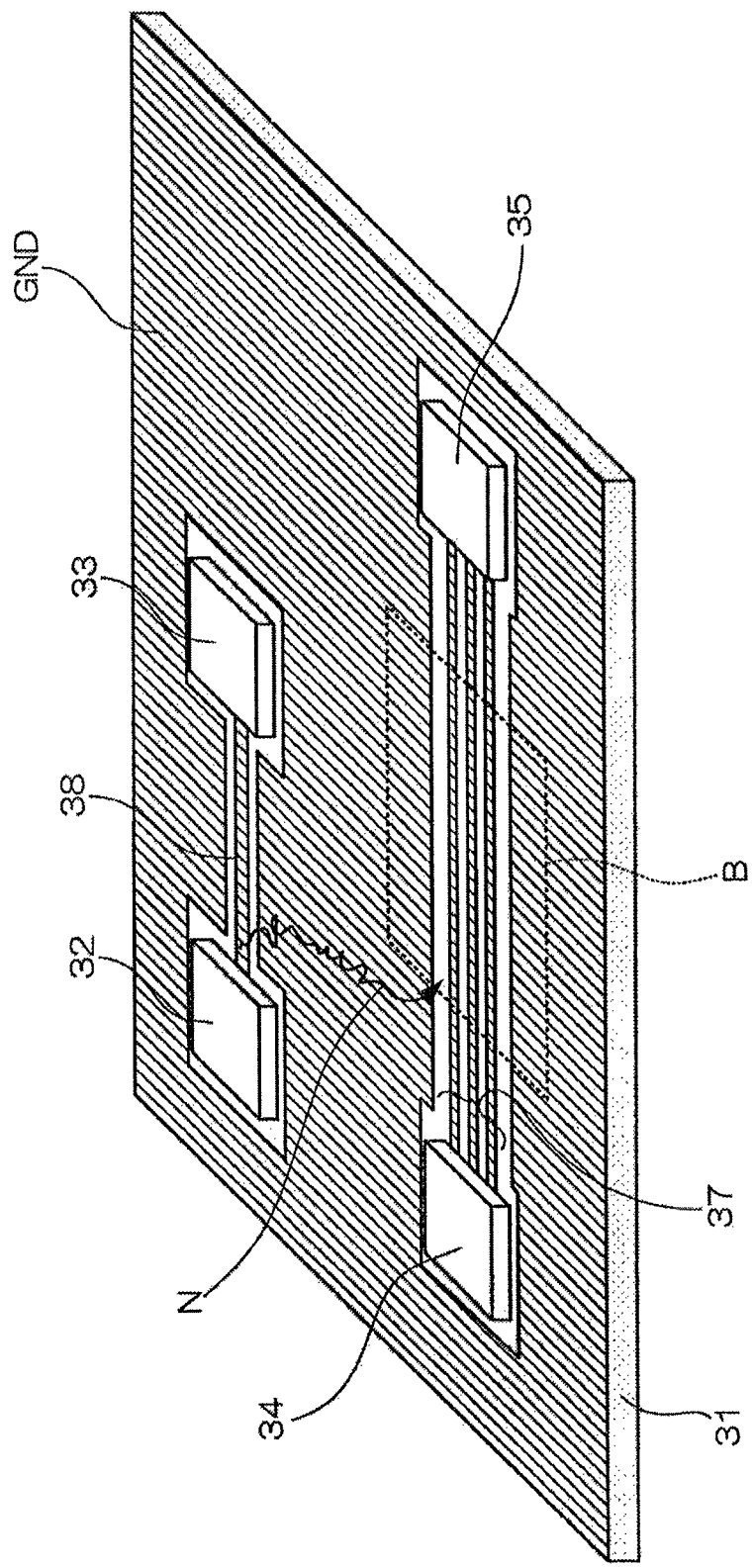
FIG. 5 is a perspective view of a circuit substrate according to an applied example of the first embodiment.

Next, an applied example of the first embodiment will be described. FIG. 5 is a perspective view of a circuit substrate 31 according to an applied example of the first embodiment. Integrated circuits (LSI circuits) 32 to 35 are mounted on the circuit substrate 31. A signal line 38 is formed between the integrated circuits 32 and 33, while a signal line 37 is formed between the integrated circuits 34 and 35. Herein, a clock signal having a frequency of 1.2 GHz is transmitted between the integrated circuits 32 and 33 through the signal line 38, while a digital signal of 500 Mbps is transmitted between the integrated circuits 34 and 35 through the signal line 37. A part of an output signal of the integrated circuit 32 is coupled with the signal line 37 as noise N.

The noise suppression structure 10 shown in FIG. 1 is applied to an area B shown by dotted lines in the circuit substrate 31. The circuit substrate 31 having the noise suppression structure 10 has a three-layered structure with a dielectric constant ($\in_r$) of 4.4. FIG. 1 shows that the substrate thickness a between the first and second wiring layers is 60 µm; the substrate thickness b between the second and third wiring layers is 150 µm; the thickness of the resonant line 13 is 20 µm; the width c of the resonant line 13 is 1 mm; the length d of the interlayer-connecting vias 16 and 17 is 18 mm. Additionally, the entire length of the signal line 37 is 40 mm; the distance between the right end of the resonant line 13 and the integrated circuit 35 is 5 mm; the distance between the left end of the resonant line 13 and the integrated circuit 34 is 15 mm.

Figure 6:
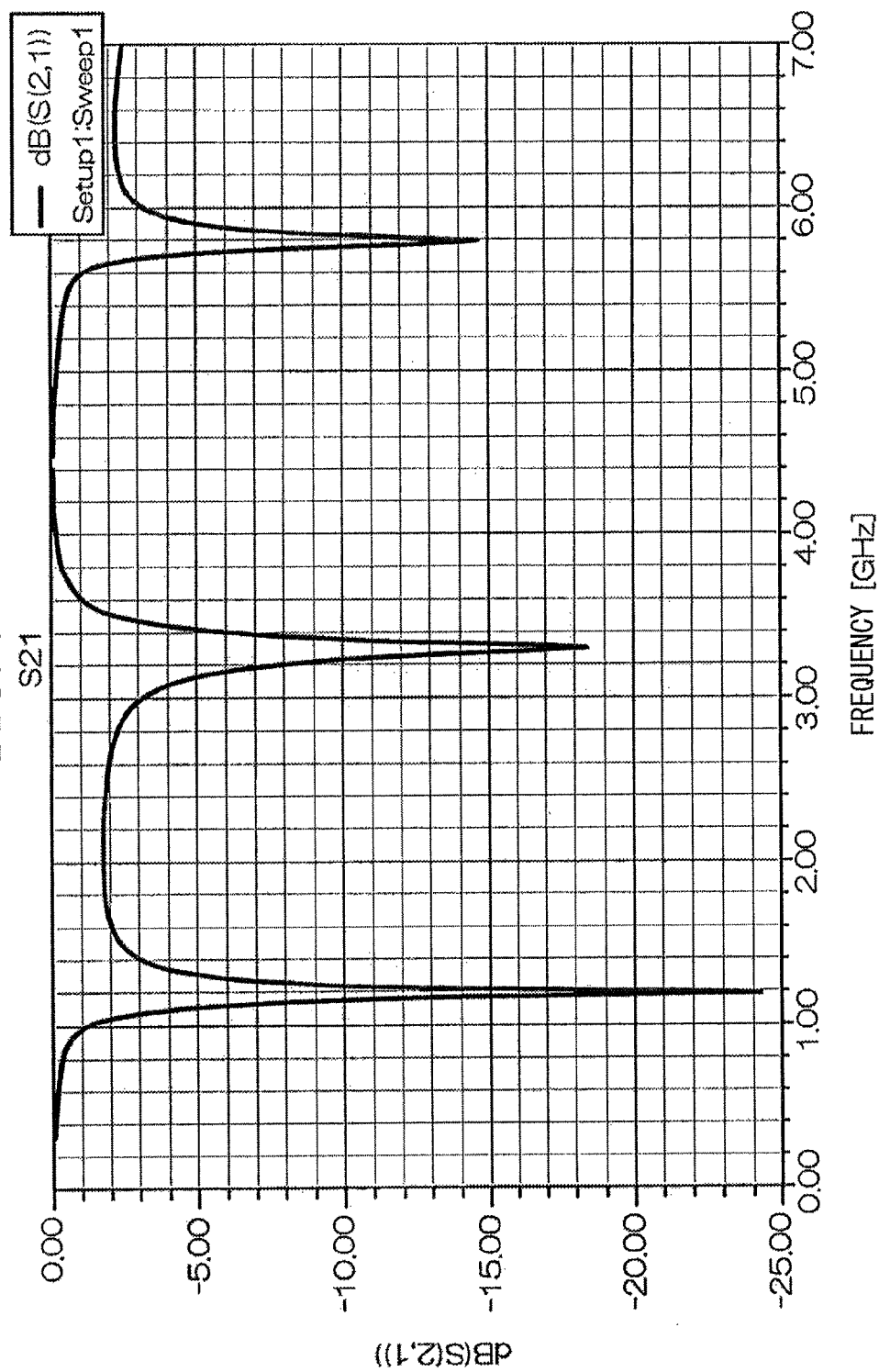
FIG. 6 is a graph showing the result of the electromagnetic field analysis of transmission characteristics of signal lines laid between integrated circuits mounted on the circuit substrate shown in FIG. 5 by use of a three-dimensional electromagnetic field simulator.

FIG. 6 is a graph showing the result of the electromagnetic field analysis on transmission characteristics of the signal line 37 by use of a three-dimensional electromagnetic simulator. This graph shows S21 representing an insertion loss among S parameters of the signal line 37, indicating a ratio of an amplitude of an input signal, applied to the integrated circuit 35, to an output signal of the integrated circuit 34. This graph shows that S21 is significantly reduced at the resonance frequency (1.2 GHz etc.) of the complex resonator while S21 is roughly maintained at 0 dB at other frequencies.

The graph of FIG. 6 shows that a signal of a specific frequency is significantly attenuated and blocked in transmission while signals of other frequencies are transmitted without being attenuated. That is, the signal line 37 behaves as a band-elimination filter. Due to the resonating structure shown in FIG. 1 being arranged in the intermediate area of the signal line 37, a digital signal of 500 Mbps output from the integrated circuit 34 may reach the integrated circuit 35, while noise N of 1.2 GHz incoming from the integrated circuit 32 is eliminated. Thus, it is possible for the signal line 37 to carry out adequate signal transmission.

The noise suppression structure 10 of the first embodiment forms a resonator with a loop-shaped slot line because the ground plane 14 is completely separated from the island electrode 15 inside the circumferential slit 18. The resonator resonates at a frequency at which the circumference thereof corresponds to multiple times of a wavelength. The resonant line 13 forms a transmission line connecting between the ground plane 14 and the island electrode 15. A part of the transmission line crossing over a slot line serves as an input part while another part thereof connected to the interlayer-connecting vias 16 and 17 serves as a short-terminal end; hence, resonance may occur at a frequency at which the length between the input part and the short-terminal end is equal to a quarter wavelength. In any resonator, an excitation source, i.e. an input part, corresponds to a part in which the signal line 12 and the resonant line 13 cross over a gap between the ground plane 14 and the island electrode 15.

Even when noise propagates through the transmission line by way of the signal line 12 and the ground plane 14, an impedance of the input part of the resonator becomes very high at a complex resonance frequency of two resonators, thus suppressing propagation of noise.

It is possible to eliminate low-frequency noise by using two resonators because the complex resonance frequency of two resonators is lower than the resonance frequency of each resonator. Reducing the resonance frequency of a single resonator may lead to an increased line length due to a long wavelength of a low frequency; however, there is a need to enlarge the shape of a resonator. Therefore, it is possible to reduce the size of the structure using a plurality of resonators compared to the size of the structure using a single resonator.

Compared to the conventional noise suppression structure, the noise suppression structure 10 of the first embodiment, which can be embedded inside the wiring layer, does not need a large mounting area on a circuit substrate. Additionally, it is unnecessary to mount inductors and capacitors, configuring the noise suppression structure 10, on a circuit substrate; hence, it is possible to reduce management costs of parts, working routines, lead times, mounting areas on circuit substrates, other costs, and design/manufacture times.

Second Embodiment

Next, the second embodiment of the present invention will be described. FIG. 7 shows a circuit substrate 21 having a noise suppression structure 20 according to the second embodiment of the present invention. In FIG. 7, (a) shows a cross-sectional view of the circuit substrate 21, and (b) shows an exploded view of the circuit substrate 21. The circuit substrate 21 has two wiring layers, wherein a signal line 22 and a resonant line 23 are formed in the first wiring layer, while a ground plane 24 having a circumferential slit 28 is formed in the second wiring layer. Additionally, an island electrode 25 is formed inside the slit 28. The left end of the resonant line 23 is connected to the island electrode 25 through an interlayer-connecting via 27, while the right end of the resonant line 23 is connected (or short-circuited) to the ground plane 24 through an interlayer-connecting via 26.

Compared to the first embodiment, the second embodiment has a feature in which the signal line 22 and the resonant line 23 are formed in the same wiring layer. Similar to the noise suppression structure 10 of the first embodiment, the noise suppression structure 20 of the second embodiment is designed such that a resonator is configured of the resonant line 23 and the island electrode 25 while a loop-type slot line resonator is configured of the island electrode 25 and the ground plane 24 which are separated from each other by way of the slit 28. Therefore, the second embodiment functions similar to the first embodiment so as to effectively suppress noise.

Third Embodiment

Figure 8:
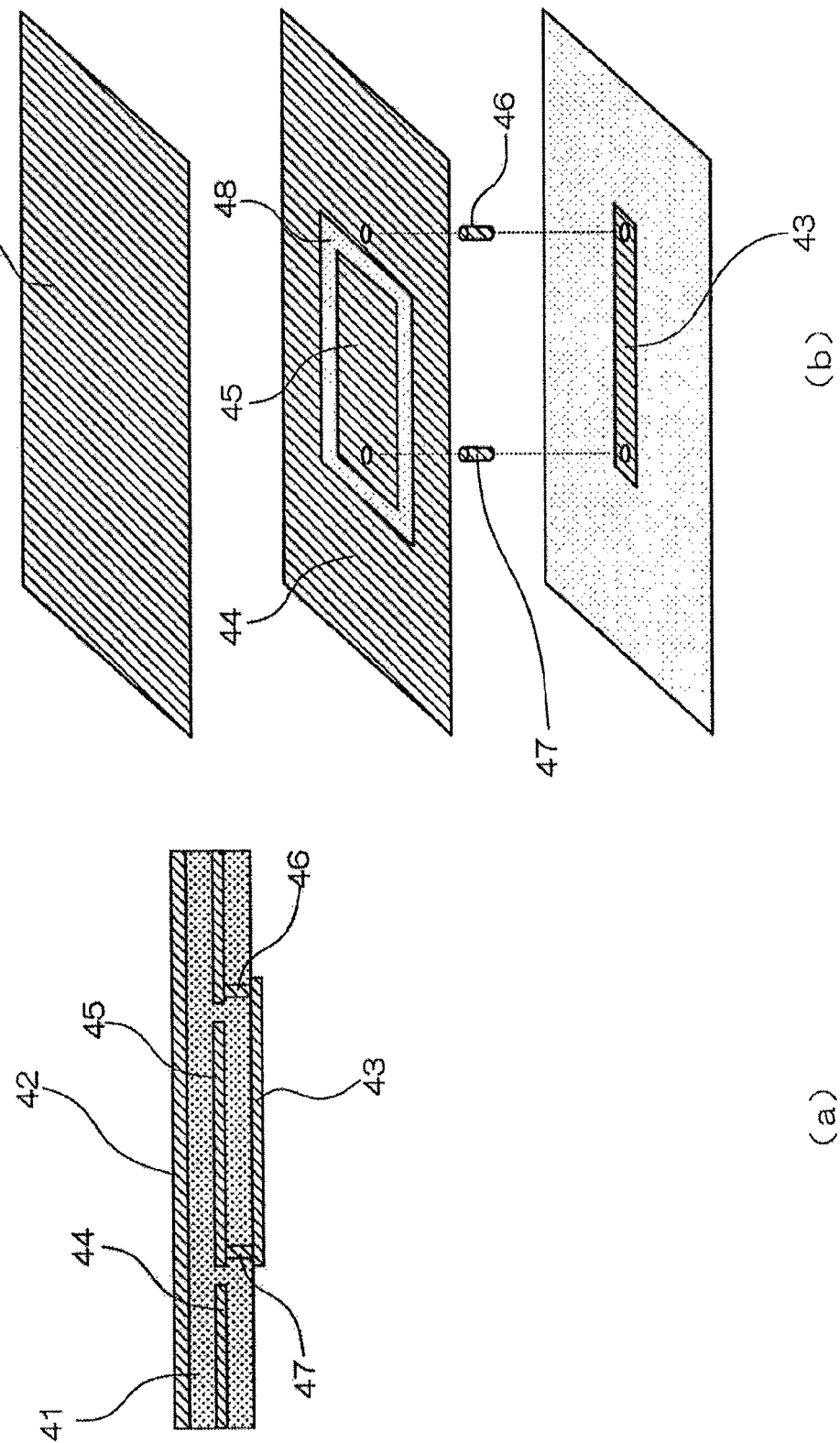
FIG. 8 shows a cross-sectional view and an exploded view with respect to a circuit substrate having a noise suppression structure according to a third embodiment of the present invention.

Next, the third embodiment of the present invention will be described. FIG. 8 shows a circuit substrate 41 having a noise suppression structure 40 according to the third embodiment. In FIG. 8, (a) shows a cross-sectional view of the circuit substrate 41, and (b) shows an exploded view of the circuit substrate 41. The circuit substrate 41 has three wiring layers, wherein a power plane 42 is formed in a first wiring layer; a ground plane 44 having a circumferential slit 48 is formed in a second wiring layer; a resonant line 43 is formed in a third wiring layer. Additionally, an island electrode 45 is formed inside the slit 48. The left end of the resonant line 43 is connected to the island electrode 45 through an interlayer-connecting via 47, while the right end of the resonant line 43 is connected to the ground plane 44 through an interlayer-connecting via 46.

Next, the function of the noise suppression structure 40 of the third embodiment will be described with reference to FIG. 8. Assuming that the power plane 42 serves as a signal line, it is possible to regard a power distribution system, configured of the power plane 42 and the ground plane 44, as one kind of a transmission line. In view of signal propagating directions, i.e. the left-right directions in FIG. 8, it is possible to illustrate an equivalent circuit of the power distribution system by use of the equivalent circuit diagram of FIG. 2 similar to the first embodiment.

In the case of the third embodiment, the transmission circuit model 21 represents a parallel-plate line which is configured of the power plane 42 and the ground plane 44 or the island electrode 45 in the area which is leftward from the right end of the slit 48. The transmission circuit model 22 represents a parallel-plate line in the area which is rightward from the right end of the slit 48. The upper transmission circuit model 24 represents a parallel-plate line which is configured of the resonant line 43 and the ground plane 44. The transmission circuit model 23 represents a parallel-plate transmission line which is configured of the resonant line 43 and the island electrode 45. The lower transmission circuit model 24 represents a slot line which is formed using the slit 48 between the ground plane 44 and the island electrode 45.

The third embodiment has features in which two transmission circuit models 24 are circulating; the left terminal 26 of the transmission circuit model 23 is short-circuited to the ground 27; the transmission circuit models 23 and 24 form the complex resonator 25 with a common input part. Additionally, the reference terminal 28 of the transmission circuit model 21 is separated from the reference terminal 29 of the transmission circuit model 22, wherein the reference terminals 28 and 29 are connected to the input part of the complex resonator 25.

According to the third embodiment, the input impedance of the complex resonator 25 becomes infinite at the resonance frequency, thus greatly attenuating signals in the entirety of the power distribution system. Therefore, the circuit substrate 41 of the third embodiment behaves as a band-elimination filter with the center frequency in the attenuation band corresponding to the resonance frequency; thus, it is possible to effectively eliminate noise in the attenuation band.

Fourth Embodiment

Figure 9:
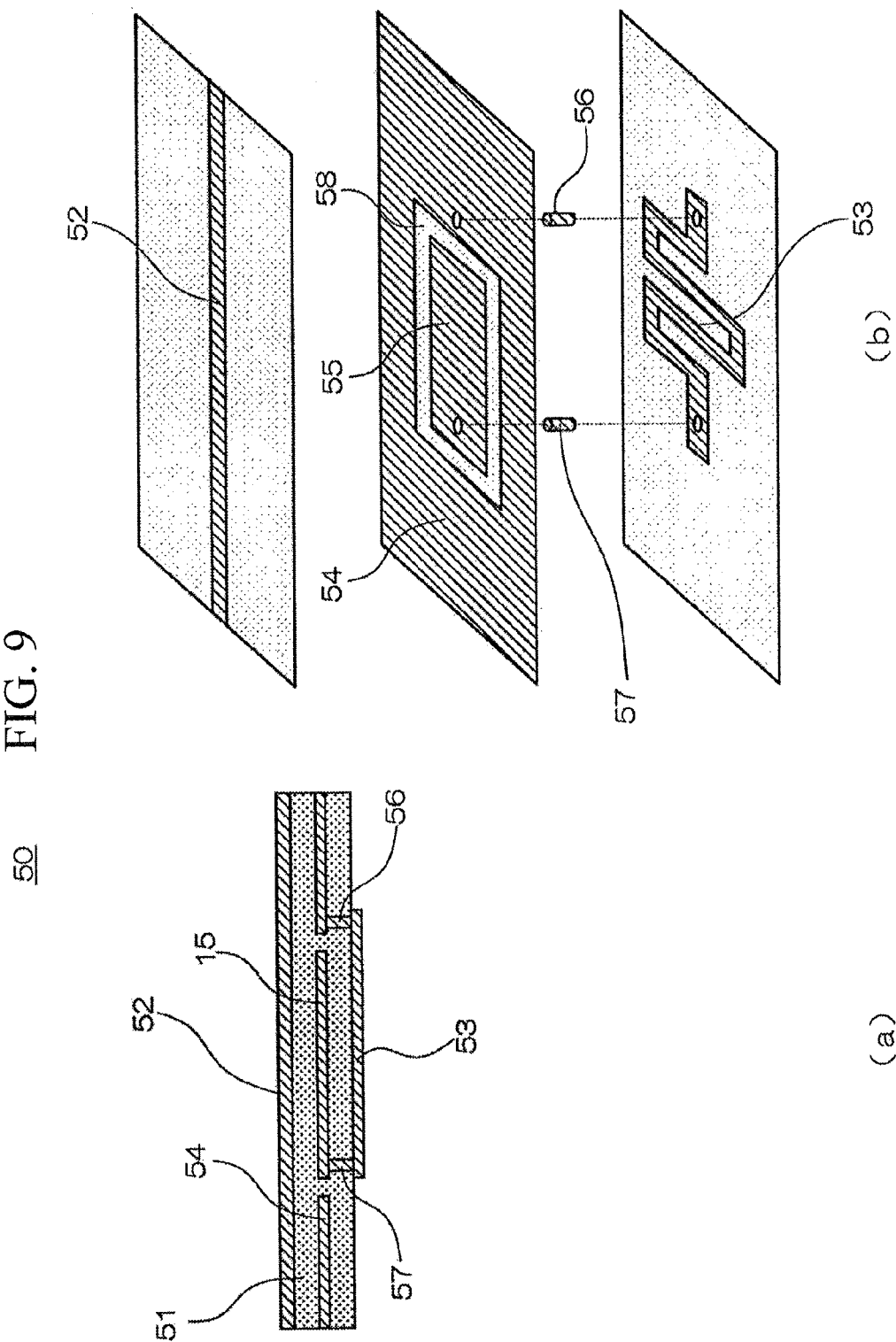
FIG. 9 shows a cross-sectional view and an exploded view with respect to a circuit substrate having a noise suppression structure according to a fourth embodiment of the present invention.

Next, the fourth embodiment of the present invention will be described. FIG. 9 shows a circuit substrate 51 having a noise suppression structure 50 according to the fourth embodiment. In FIG. 9, (a) shows a cross-sectional view of the circuit substrate 51, and (b) shows an exploded view of the circuit substrate 51. The circuit substrate 51 has three wiring layers, wherein a signal line 52 is formed in a first wiring layer; a ground plane 54 having a circumferential slit 58 is formed in a second wiring layer; a resonant line 53 having meandering shape is formed in a third wiring layer. An island electrode 55 is formed inside the slit 58. The left end of the resonant line 53 is connected to the island electrode 55 through an interlayer-connecting via 57, while the right end of the resonant line 53 is connected to the ground plane 54 through an interlayer-connecting via 56.

The noise suppression structure 50 of the fourth embodiment includes the resonant line 53 having a meandering shape, which may embrace an adequate line length of a resonator within a narrow area; hence, it is possible to reduce the occupied area of a resonator in the third wiring layer while maintaining a desired resonance frequency.

Fifth Embodiment

Next, the fifth embodiment of the present invention will be described. FIG. 10 shows a circuit substrate 61 having a noise suppression structure 60 according to the fifth embodiment. In FIG. 10, (a) shows a cross-sectional view of the circuit substrate 61, and (b) shows an exploded view of the circuit substrate 61. The circuit substrate 61 has three wiring layers, wherein a signal line 62 is formed in a first wiring layer; a ground plane 64 with a slit 68 having a circumferential and uneven shape is formed in a second wiring layer; a resonant line 63 is formed in a third wiring layer. The left end of the resonant line 63 is connected to an island electrode 65 through an interlayer-connecting via 67, while the right end of the resonant line 63 is connected to the ground plane 64 through an interlayer-connecting via 66.

In the noise suppression structure 60 of the fifth embodiment in which the slit 68 and the island electrode 65 do not have a rectangular shape but an uneven shape, a slot line configured of the ground plane 64 and the island electrode 65 has a meandering shape, which may embrace an adequate line length of a one-wavelength loop resonator within a narrow area by way of the slit 68. Therefore, it is possible to reduce the occupied area of a resonator in the second wiring layer while maintaining a desired resonance frequency.

Sixth Embodiment

Next, the sixth embodiment of the present invention will be described.

Compared to the first to fifth embodiments in which a noise suppression structure configured of a ground plane and a resonant line is formed solely in a lower adjacent wiring layer in view of a signal line, it is possible to arrange a noise suppression structure in each of the upper side and the lower side about a signal line.

Figure 11:
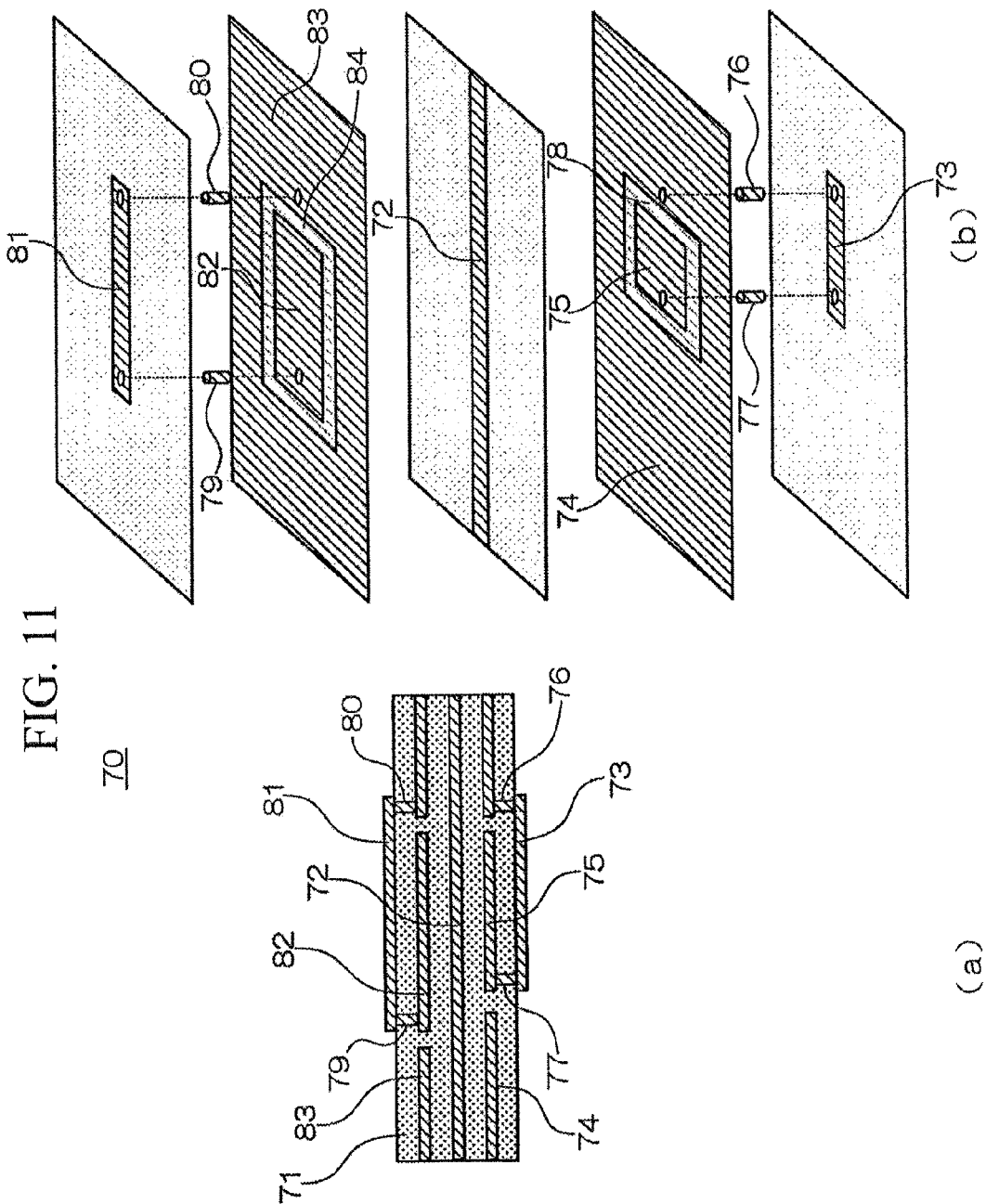
FIG. 11 shows a cross-sectional view and an exploded view with respect to a circuit substrate having a noise suppression structure according to a sixth embodiment of the present invention.
Figure 12:
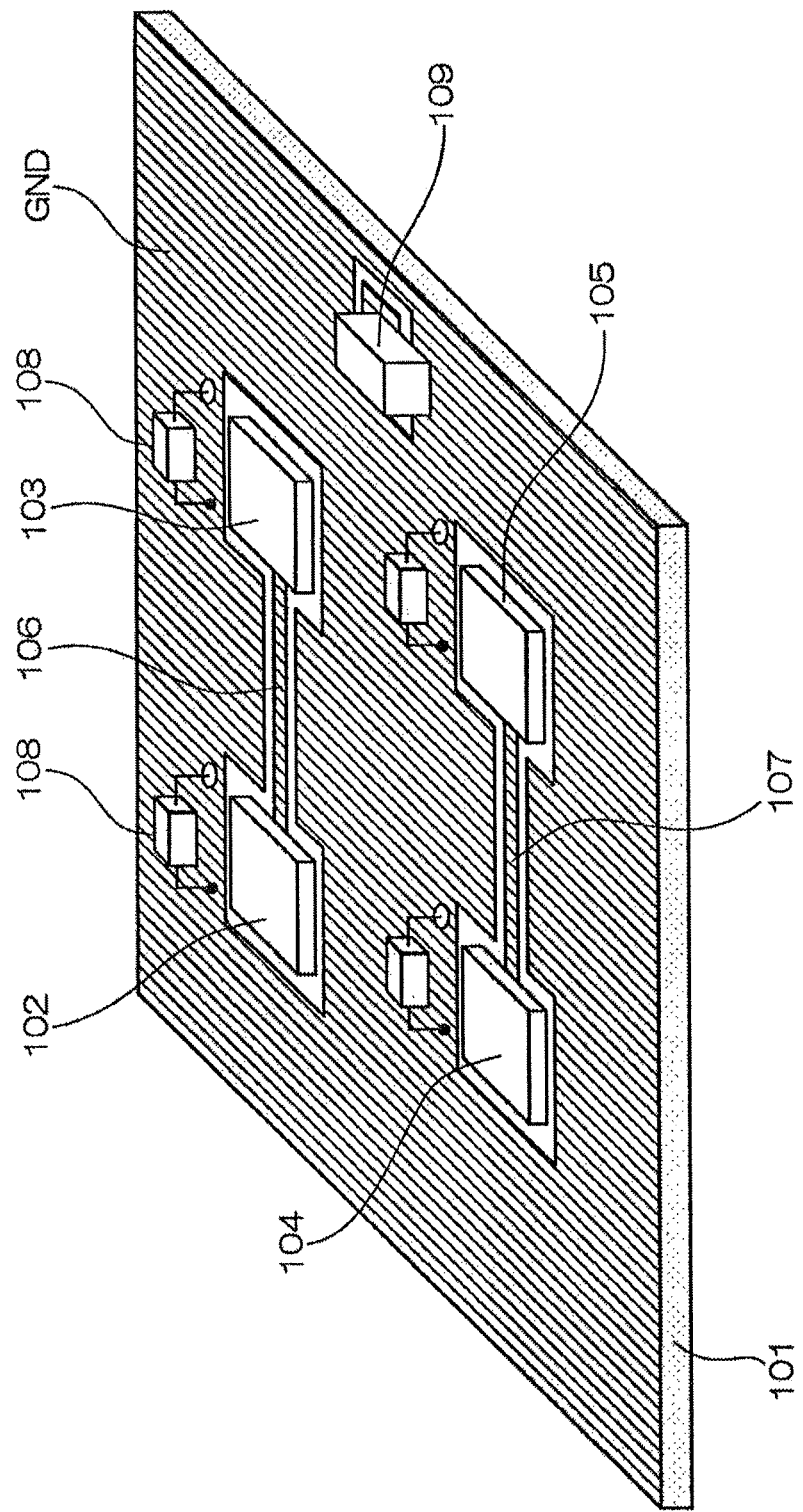
FIG. 12 is a perspective view of a circuit substrate mounting bypass capacitors around integrated circuits.
Figure 13:
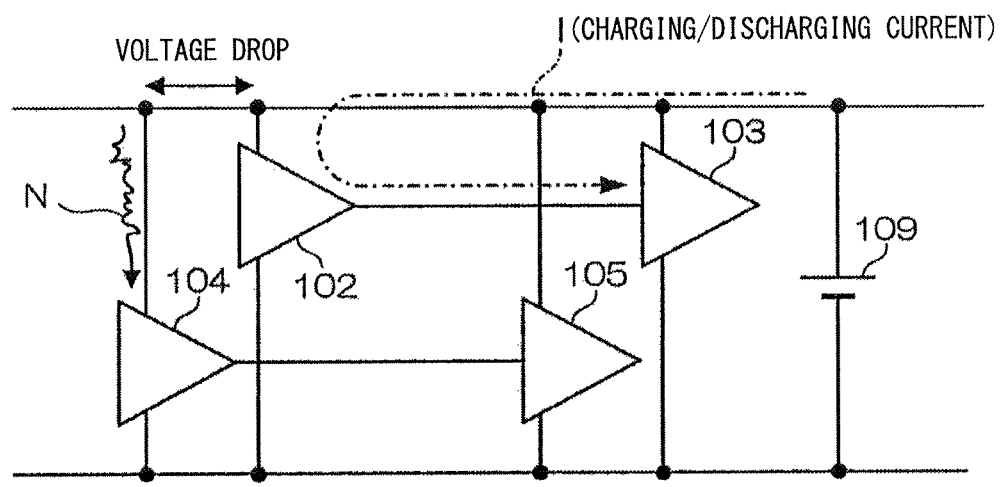
FIG. 13 is a circuit diagram for illustrating a power noise generation principle in the circuit substrate of FIG. 12.
Figure 14:
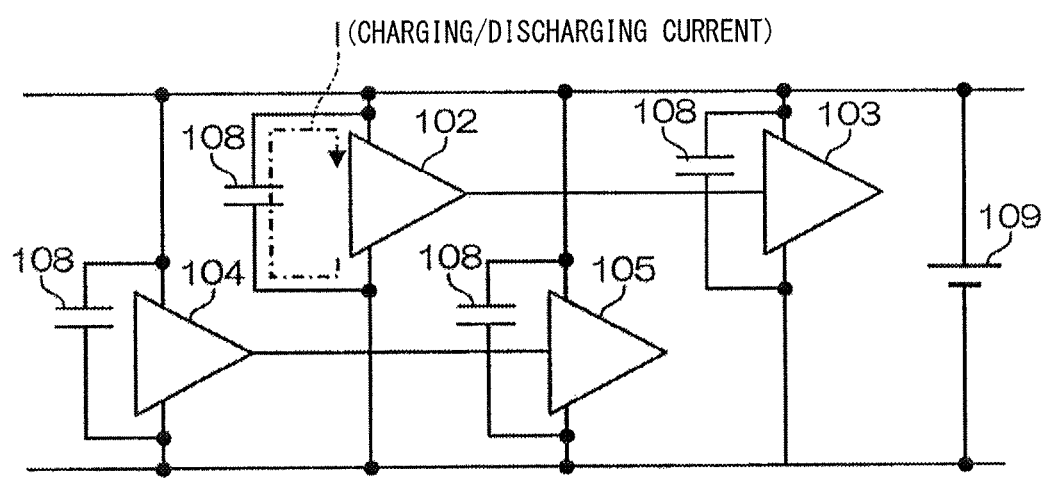
FIG. 14 is a circuit diagram for illustrating a power noise suppression operation using bypass capacitors in the circuit substrate of FIG. 12.
Figure 15:
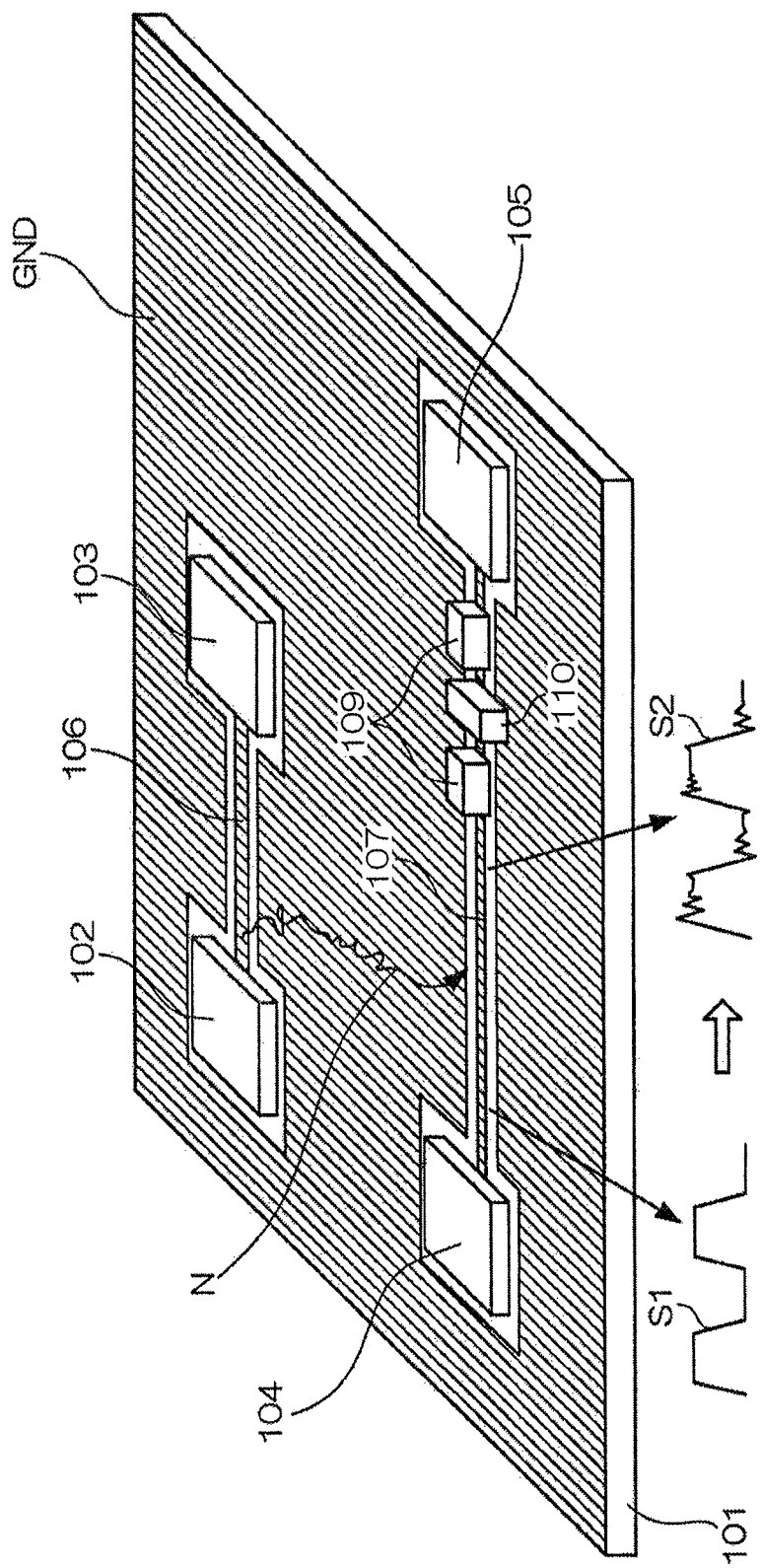
FIG. 15 is a perspective view of a circuit substrate mounting an LPF, which is configured of an inductor and a capacitor, on a signal line laid between integrated circuits.
Figure 16:
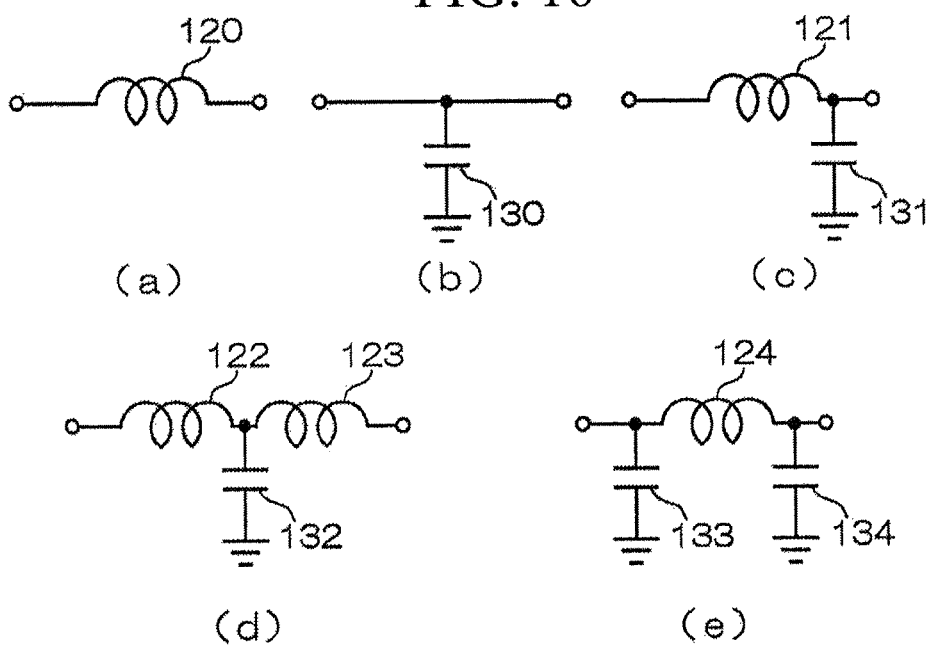
FIG. 16 shows simple circuit diagrams of LPFs applicable to the circuit substrate of FIG. 15.
Figure 17:
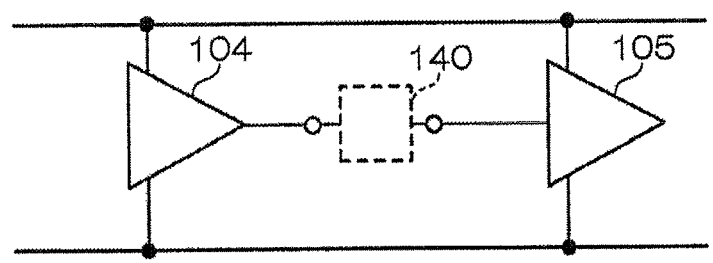
FIG. 17 is a simple circuit diagram showing the configuration of arranging an LPF between integrated circuits on the circuit substrate of FIG. 15.

FIG. 11 shows a circuit substrate 71 having a noise suppression structure 70 according to a sixth embodiment. In FIG. 11, (a) shows a cross-sectional view of the circuit substrate 71, and (b) shows an exploded view of the circuit substrate 71. As shown in FIG. 11(b), the circuit substrate 71 has five wiring layers, wherein a first wiring layer, a second wiring layer, a third wiring layer (i.e. an intermediate wiring layer), a fourth wiring layer, and a fifth wiring layer counted in descending order are sequentially laminated. In the circuit substrate 71, a signal line 72 is formed in a third wiring layer; a ground plane 74 having a circumferential slit 78 is formed in a fourth wiring layer; a resonant line 73 is formed in a fifth wiring layer. An island electrode 75 is formed inside the slit 78. The left end of the resonant line 73 is connected to the island electrode 75 through an interlayer-connecting via 77, while the right end of the resonant line 73 is connected to the ground plane 74 through an interlayer-connecting via 76.

Additionally, a resonant line 81 is formed in the first wiring layer, while a ground plane 83 having a circumferential slit 84 is formed in the second wiring layer. An island electrode 82 is formed inside the slit 84. The left end of the resonant line 81 is connected to the island electrode 82 through an interlayer-connecting via 79, while the right end of the resonant line 81 is connected to the ground plane 83 through an interlayer-connecting via 80.

A resonator is formed in each of an upper wiring layer and a lower wiring layer about the signal line 72 in the third wiring layer; hence, each resonator may independently serve as a filter.

In the sixth embodiment, the size of the slit 84 of the second wiring layer differs from the size of the slit 78 of the fourth wiring layer, whereby their slot lines differ from each other in terms of circumferences, and therefore they differ from each other in terms of one-wavelength resonance frequencies. Additionally, they have different resonance frequencies because the length of the resonant line 81 of the first wiring layer differs from the length of the resonant line 73 of the fifth wiring layer. Therefore, an upper resonator and a lower resonator about the signal line 72 have different complex resonance frequencies. The entirety of the noise suppression structure 70 may work as a noise suppression filter when either an upper resonator or a lower resonator triggers resonance; therefore, it is possible to double the band-elimination frequency by arranging a pair of noise suppression structures having different resonance frequencies in the upper and lower wiring layers about the signal line 72.

Alternatively, when both the upper and lower resonators about the signal line 72 are designed with the same dimensions, the eliminated frequency bandwidth may be identical to that of a resonator which is arranged in one of the upper and lower wiring layers about the signal line 72; hence, it is possible to increase a bandwidth or an attenuation of a signal subjected to band elimination.

As a postscript, a resonator is configured of a first conductor (e.g. a signal line), a second conductor (e.g. a ground plane), and a third conductor (e.g. a resonant line). Herein, it is possible to adopt various types of structures for resonators. For example, it is possible to employ a first conductor having a linear shape and a second conductor having a planar shape. Alternatively, it is possible to employ first and second conductors both having a planar shape. Or, it is possible to employ a third conductor having a linear shape.

Lastly, the present invention is not necessarily limited to the foregoing embodiments and may embrace a variety of variations and design choices within the scope of the appended claims.

INDUSTRIAL APPLICABILITY

The present invention is directed to a circuit substrate having a noise suppression structure, which can be designed with a simple configuration and which can be reduced in size; therefore, the circuit substrate of the present invention can be designed with shapes and dimensions specialized for various types of electronic devices and communication devices; thus, the present invention is applicable to a wide range of fields such as personal computers having wireless communication functions and handheld information terminals.

REFERENCE SIGNS LIST 11, 21, 31, 41, 51, 61, 71 circuit substrate
12, 22, 37, 38, 52, 62, 72 signal line
13, 23, 43, 53, 63, 73, 81 resonant line
14, 24, 44, 54, 64, 74, 83 ground plane
15, 25, 45, 55, 65, 75, 82 island electrode
16, 17, 26, 27, 46, 47, 56, 57, 66, 67, 77, 79, 80 interlayer-connecting via
18, 28, 48, 58, 68, 78, 84 slit
32, 33, 34, 35 integrated circuit
42 power plane

The invention claimed is:

1. A circuit substrate in which a transmission line is formed using a first conductor and a second conductor which are positioned opposite to each other in different wiring layers, the circuit substrate comprising:
 a circumferential slit formed in the second conductor;
 an island electrode which is formed inside the slit and which is separated from the second conductor; and
 a third conductor which is formed in a different wiring layer than the second conductor,
 wherein the third conductor is connected to the second conductor and the island electrode through a plurality of interlayer-connecting vias, and
 wherein the first conductor is arranged to partially overlap with the island electrode in plan view, thus forming a complex resonator including the transmission line.

2. The circuit substrate according to claim 1, wherein the island electrode is connected to the second conductor through the third conductor.

3. The circuit substrate according to claim 1, wherein the third conductor is arranged to overlap with the island electrode in plan view.

4. The circuit substrate according to claim 1, wherein the third conductor is arranged to overlap with the island electrode and the second conductor in plan view.

5. The circuit substrate according to claim 1, wherein the first conductor is arranged to cross over the slit at least once.

6. The circuit substrate according to claim 1, wherein the third conductor is formed in a same wiring layer as the first conductor.

7. The circuit substrate according to claim 1, wherein the third conductor is formed in a linear and meandering shape.

8. The circuit substrate according to claim 1, wherein the slit is formed in a circumferential and meandering shape.

9. The circuit substrate according to claim 1, wherein a structure configured of the second conductor, the slit, and the island electrode is formed in each of upper and lower wiring layers about the first conductor.

10. The circuit substrate according to claim 1, wherein the first conductor is a signal line, the second conductor is a ground plane, and the third conductor is a resonant line.

* * * * *